(12) United States Patent
Goda

(10) Patent No.: US 9,997,247 B2
(45) Date of Patent: Jun. 12, 2018

(54) MEMORY DEVICES HAVING SOURCE LINES DIRECTLY COUPLED TO BODY REGIONS AND METHODS

(71) Applicant: Micron Technology, Inc., Boise, ID (US)

(72) Inventor: Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/339,374

(22) Filed: Oct. 31, 2016

(65) Prior Publication Data

US 2017/0047120 A1 Feb. 16, 2017

Related U.S. Application Data

(62) Division of application No. 14/299,813, filed on Jun. 9, 2014, now Pat. No. 9,484,100, which is a division of application No. 13/011,223, filed on Jan. 21, 2011, now Pat. No. 8,750,040.

(51) Int. Cl.

| | |
|---|---|
| *G11C 16/14* | (2006.01) |
| *H01L 27/11524* | (2017.01) |
| *H01L 27/11556* | (2017.01) |
| *G11C 16/10* | (2006.01) |
| *G11C 16/04* | (2006.01) |

(52) U.S. Cl.
CPC .......... *G11C 16/14* (2013.01); *G11C 16/0483* (2013.01); *G11C 16/10* (2013.01); *H01L 27/11524* (2013.01); *H01L 27/11556* (2013.01)

(58) Field of Classification Search
CPC . G11C 16/0483; G11C 16/10; G11C 11/5635; G11C 16/12
See application file for complete search history.

(56) References Cited

U.S. PATENT DOCUMENTS

| | | | |
|---|---|---|---|
| 4,827,448 A | 5/1989 | Kuo | |
| 5,721,871 A | 2/1998 | Ginsberg et al. | |
| 5,802,555 A | 9/1998 | Shigeeda | |
| 6,118,159 A | 9/2000 | Willer et al. | |
| 6,718,432 B1 | 4/2004 | Srinivasan | |
| 6,744,094 B2 | 6/2004 | Forbes | |
| 7,369,438 B2 | 5/2008 | Lee et al. | |
| 7,403,417 B2 | 7/2008 | Cohen | |

(Continued)

FOREIGN PATENT DOCUMENTS

| | | |
|---|---|---|
| CN | 101055875 A | 10/2007 |
| CN | 101461011 A | 6/2009 |

(Continued)

OTHER PUBLICATIONS

"Chinese Application Serial No. 201280006100.4, Office Action dated Feb. 4, 2017", W/English Translation, 7 pgs.

(Continued)

*Primary Examiner* — Tuan T Nguyen
(74) *Attorney, Agent, or Firm* — Schwegman Lundberg & Woessner, P.A.

(57) ABSTRACT

Memory devices, memory cell strings and methods of operating memory devices are shown. Configurations described include directly coupling an elongated body region to a source line. Configurations and methods shown should provide a reliable bias to a body region for memory operations such as erasing.

17 Claims, 5 Drawing Sheets

(56) References Cited

U.S. PATENT DOCUMENTS

| | | | |
|---|---|---|---|
| 8,174,893 B2 | 5/2012 | Goda et al. | |
| 8,274,108 B2 | 9/2012 | Katsumata et al. | |
| 8,750,040 B2 | 6/2014 | Goda | |
| 9,484,100 B2 | 11/2016 | Goda et al. | |
| 2003/0081449 A1 | 5/2003 | Beucler | |
| 2004/0130942 A1 | 7/2004 | Yeh et al. | |
| 2004/0202028 A1 | 10/2004 | Cioaca | |
| 2005/0201182 A1 | 9/2005 | Osada et al. | |
| 2006/0054976 A1 | 3/2006 | Verhoeven | |
| 2007/0296015 A1 | 12/2007 | Aritome | |
| 2008/0002475 A1 | 1/2008 | Yang et al. | |
| 2008/0239847 A1 | 10/2008 | Jung et al. | |
| 2009/0022001 A1 | 1/2009 | Morishita et al. | |
| 2009/0207642 A1 | 8/2009 | Shimano et al. | |
| 2010/0034028 A1 | 2/2010 | Katsumata et al. | |
| 2010/0110789 A1 | 5/2010 | Chandrasekhar | |
| 2010/0177566 A1 | 7/2010 | Kim et al. | |
| 2010/0207190 A1 | 8/2010 | Katsumata et al. | |
| 2010/0207194 A1 | 8/2010 | Tanaka et al. | |
| 2010/0213527 A1 | 8/2010 | Shim et al. | |
| 2010/0214838 A1 | 8/2010 | Hishida et al. | |
| 2010/0232224 A1 | 9/2010 | Maeda et al. | |
| 2010/0244119 A1 | 9/2010 | Fukuzumi et al. | |
| 2010/0254194 A1* | 10/2010 | Chou | G11C 16/0475 365/185.21 |
| 2011/0103153 A1 | 5/2011 | Katsumata et al. | |
| 2012/0134215 A1 | 5/2012 | Goda | |
| 2012/0188825 A1 | 7/2012 | Goda | |
| 2012/0199877 A1* | 8/2012 | Liu | H01L 27/1158 257/192 |
| 2012/0262987 A1* | 10/2012 | Kuo | G11C 11/5635 365/185.11 |
| 2013/0178025 A1 | 7/2013 | Haller et al. | |
| 2013/0194867 A1 | 8/2013 | Fukuda et al. | |
| 2014/0286106 A1 | 9/2014 | Goda | |
| 2014/0313833 A1 | 10/2014 | Liu et al. | |
| 2016/0049192 A1 | 2/2016 | Lee | |

FOREIGN PATENT DOCUMENTS

| | | |
|---|---|---|
| CN | 101515478 A | 8/2009 |
| CN | 101764096 A | 6/2010 |
| CN | 103329270 A | 9/2013 |
| JP | 2005260014 A | 9/2005 |
| JP | 2010166055 A | 7/2010 |
| JP | 2010199235 A | 9/2010 |
| JP | 2010212518 A | 9/2010 |
| JP | 2010225946 A | 10/2010 |
| KR | 1020090017587 A | 2/2009 |
| TW | 201237874 A | 9/2012 |
| TW | I525623 B | 3/2016 |
| WO | WO-2012100056 A2 | 7/2012 |

OTHER PUBLICATIONS

"Chinese Application Serial No. 201280006100.4, Office Action dated Jul. 4, 2017", w/English Translation, 8 pgs.
"Chinese Application Serial No. 201280006100.4, Response Filed Apr. 18, 2017 to Office Action dated Feb. 4, 2017", (W/ English Claims), 9 pgs.
"Chinese Application Serial No. 201280006100.4, Response filed Jul. 13, 2017 to Office Action dated Jul. 4, 2017", w/English Claims, 8 pgs.
"Chinese Application Serial No, 201280006100.4, Amendment filed May 9, 2014", w/English Claims, 10 pgs.
"Chinese Application Serial No. 201280006100.4, Office Action dated Jan. 5, 2016", W/ English Translation, 7 pgs.
"Chinese Application Serial No. 201280006100.4, Office Action dated Oct. 13, 2014", W/ English Translation, 10 pgs.
"Chinese Application Serial No. 201280006100.4, Response filed Apr. 14, 2016 to Office Action dated Jan. 5, 2016", W/ English Claims, 13 pgs.
"Chinese Application Serial No. 201280006100.4, Response filed Jul. 30, 2014 to Office Action dated Oct. 13, 2014", W/ English Claims, 4 pgs.
"International Application Serial No. PCT/US2012/021873, International Preliminary Report on Patentability dated Aug. 1, 2013", 6 pgs.
"International Application Serial No. PCT/US2012/021873, International Search Report dated Jul. 30, 2012", 3 pgs.
"International Application Serial No. PCT/US2012/021873, Written Opinion dated Jul. 30, 2012", 4 pgs.
"Japanese Application Serial No. 2013-550579, Office Action dated Jun. 2, 2015", W/ English Translation, 15 pgs.
"Japanese Application Serial No. 2013-550579, Office Action dated Dec. 8, 2015", W/ Machine Translation, 6 pgs.
"Japanese Application Serial No. 2013-550579, Response filed Mar. 3, 2016 to Office Action dated Dec. 8, 2015", W/ English Claims, 5 pgs.
"Japanese Application Serial No. 2013-550579, Response filed Aug. 31, 2015 to Office Action dated Jun. 2, 2015", W/ Machine Translation, 11 pgs.
"Chinese Application Serial No. 201280006100.4, Office Action dated Sep. 28, 2017", With English Translation, 5 pgs.
"Chinese Application Serial No. 201280006100.4, Response filed Nov. 29, 2017 to Office Action dated Sep. 28, 2017", w/ Amended Claims, 12 pgs.

* cited by examiner

US 9,997,247 B2

MEMORY DEVICES HAVING SOURCE LINES DIRECTLY COUPLED TO BODY REGIONS AND METHODS

PRIORITY APPLICATION

This application is a divisional of U.S. application Ser. No. 14/299,813, filed Jun. 9, 2014, which is a divisional of U.S. application Ser. No. 13/011,223, filed Jan. 21, 2011, now issued as U.S. Pat. No. 8,750,040, all of which are incorporated herein by reference in their entirety.

BACKGROUND

Higher memory density is always in demand to provide smaller devices with higher memory capacity. Forming memory devices laterally on a surface of a semiconductor chip uses a great deal of chip real estate. Improved memory devices are needed with new configurations to further increase memory density beyond traditional laterally formed memory devices.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical changes, etc. may be made.

The term "horizontal" as used in this application is defined as a plane parallel to the conventional plane or surface of a substrate, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1:
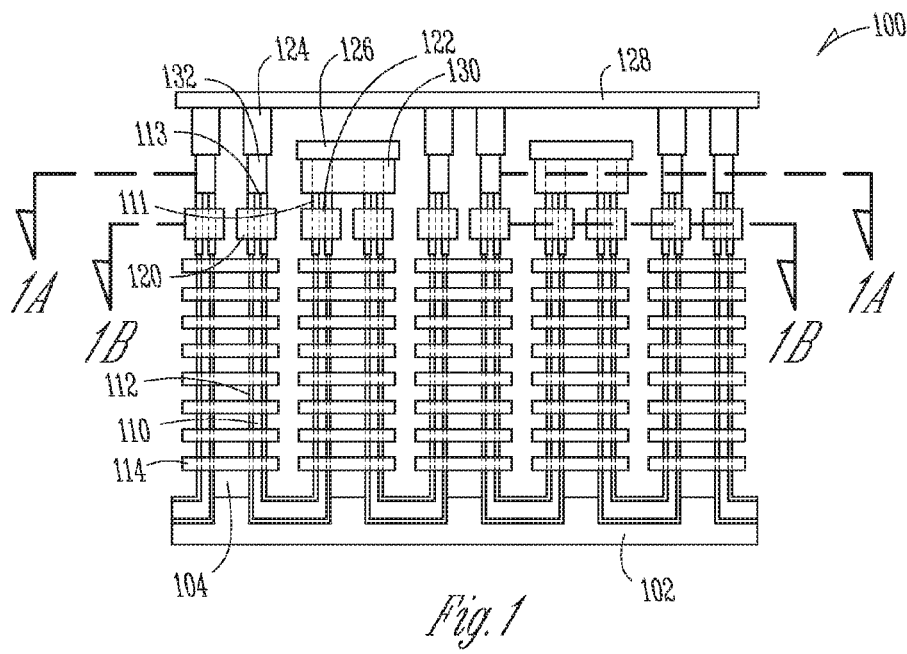
FIG. 1 shows a memory device according to an embodiment of the invention.
Figure 1A:
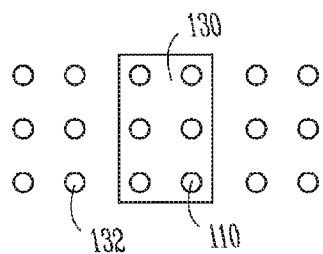
FIG. 1A shows a cross section along line 1A-1A from FIG. 1 according to an embodiment of the invention.
Figure 1B:
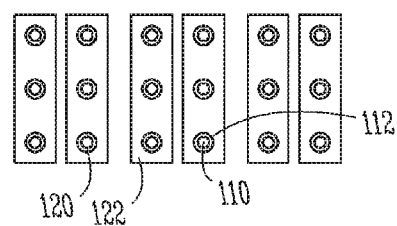
FIG. 1B shows a cross section along line 1B-1B from FIG. 1 according to an embodiment of the invention.

FIGS. 1, 1A, and 1B show a memory device 100 formed on a substrate 102. A charge storage layer(s) 112 (e.g., a combination of a tunnel dielectric layer, a polysilicon layer, and a charge blocking layer; a combination of a nitride layer, an oxide layer, and a nitride layer; or other any other layer or combination of layers that can provide a charge storage function, whether currently known or future developed), substantially surrounds an elongated body region 110 to form a respective charge structure corresponding to each of a plurality of gates 114 (which may also substantially surround respective cross sections of the elongated body region 110 and charge storage layer(s) 112). A first select gate 120 and a second select gate 122 are shown to selectively couple the elongated body region 110 to drain region 132 and a source region 130, respectively. A dielectric 104 can fill in spaces between components such as those described above.

FIG. 1A shows an embodiment where the elongated body region 110 forms a "U" shape with a pair of upward facing ends 111, 113. Another example configuration (not shown) includes a linear, vertical, elongated body region 110 with one end facing upward, and the other end facing downward. Another example configuration (not shown) includes a horizontal, linear, elongated body region 110 with ends on either side. Embodiments with two upward facing ends, 111, 113, such as the "U" shaped configuration, can enable easier formation of some components at the ends 111, 113 of the elongated body region 110 during manufacture, compared to embodiments where components are formed deeper in the structure.

In one example, the elongated body region 110 is formed from a p type semiconductor material, such as p-type polysilicon. The elongated body region 110 can be formed in multiple process steps, such as where a first end 111 is formed in a different polysilicon deposition step than that used to form other portions of the elongated body region 110, such as second end 113. Accordingly, in at least some embodiments, first end 111 may be higher than second end 113. A source region 130 and a drain region 132 are shown coupled to the first end 111 and the second end 113 of the elongated body region 110, respectively. In one example, the source region 130 and the drain region include n type semiconductor material, such as n+ polysilicon. In operation, the pathway of source region 130, to elongated body region 110, to drain region 132 acts as an n-p-n transistor, with select gates 120, 122, and gates 114 operating to allow, or inhibit signal transmission along the way.

A source line 126 and a data line, such as bitline 128, are shown coupled to the source region 130 and the drain region 132 respectively. In one embodiment, a plug 124 is used to directly couple (e.g., directly physically connect to form an electrical connection, or otherwise form an electrical connection without a potential for a n-p or p-n junction breakdown) the bitline 128 to the drain region 132. Each of the source line 126, bitline 128 and plug 124 can comprise, consist of, or consist essentially of metal, such as aluminum, copper, or tungsten, or alloys of these or other conductor metals. In the present disclosure, the term "metal" further includes metal nitrides, or other materials that operate primarily as conductors.

As noted above, FIG. 1 shows the drain region 132 directly coupled to the plug 124, which effectively couples the drain region 132 to the bitline 128. The source region 130 is shown directly coupled to the source line 126. The elongated body region 110 is also directly coupled to the source line 126.

The cross section along line 1B-1B shows the select gates 120 and 122. As can be seen in the cross section, in one embodiment, the select gates 120 and 122 are substantially continuous along a row. In this configuration, actuation of a select gate 120 or 122 actuates a plurality of elongated body regions at a time.

The cross section shown along line 1A-1A shows a number of drain regions 132 and a source region 130. As can be seen in the cross section, in one embodiment, the drain regions 132 are separate, while the source region 130 is substantially continuous, with a single source region 130 used for a plurality of elongated body regions 110. In one example the source region 130 substantially surrounds a cross section of a first end 111 of each of a plurality of elongated body regions 110.

By directly coupling the elongated body region 110 to the source line 126, the elongated body region 110 has the ability to be biased, and operate less as a floating body element. Biasing of the elongated body region 110 via a direct coupling can provide reliable memory operations such as an erase operation in particular.

Figure 2A:
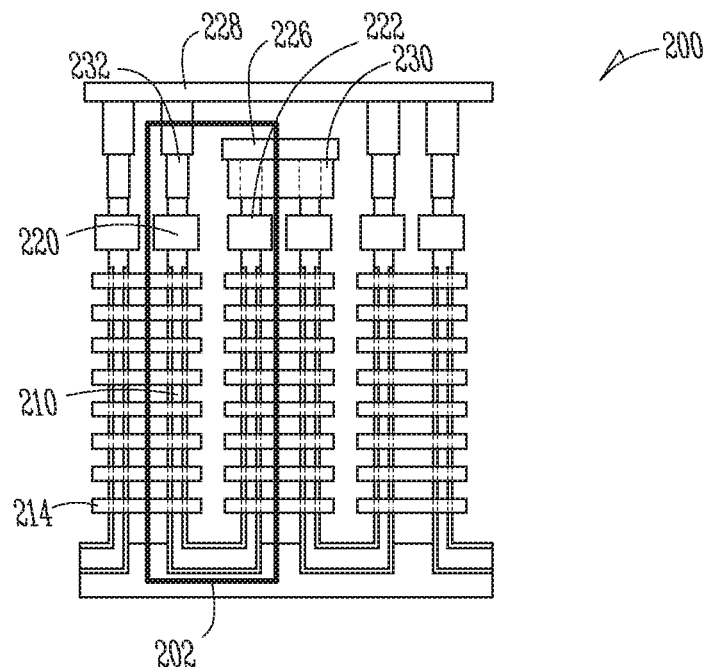
FIG. 2A shows a memory device during an erase operation according to an embodiment of the invention.
Figure 2B:
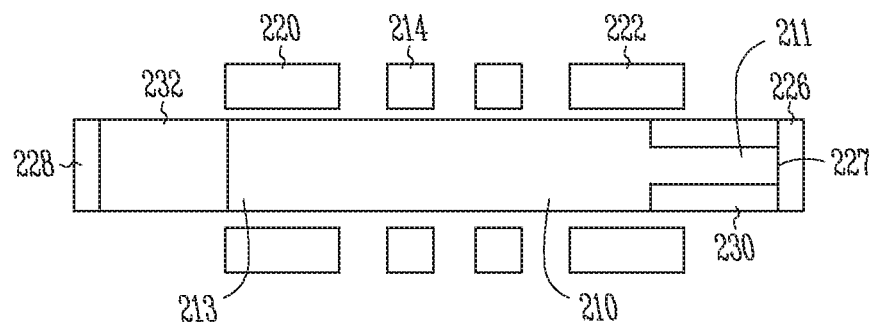
FIG. 2B shows a block diagram of a portion of the memory device from FIG. 2A during an erase operation according to an embodiment of the invention.

An example erase operation, according to an embodiment of the invention, is illustrated with respect to FIGS. 2A and 2B. A memory device 200, similar to embodiments described above, is shown with an example memory cell string 202 circled in the figures. According to one such erase operation embodiment, with the bitline 228 and select gates 220, 222 of string 202 floating, the source line 226, and thus the elongated body region 210 of the string 202, is biased to an erase voltage (e.g., approximately 20 volts), and the gates 214 of the string 202 are biased to a selected voltage (e.g., approximately 0 volts). Given the provided example biasing voltages, the select gates 220, 222 of string 202 are thus coupled up to approximately 15 volts, while the bit line 228 (and plug 124) is coupled up to approximately 20 volts. The potential difference between the body region 110 and gates 214 (e.g., 20 volts to zero volts) is used to erase stored charge from the charge storage structure adjacent to each individual gate 214 in the memory cell string 202.

Because the elongated body region 210 is directly coupled to the source line 226, the elongated body region 210 is biased when a bias is applied to the source line 226. Direct coupling between the elongated body region 210 and the source line 226 provides a charge pathway between the elongated body region 210 and the source line 226 that avoids junction breakdown between an n-type region and a p type region.

In FIG. 2B, the direct coupling of the elongated body region 210 to the source line 226 can be seen at a first end 211 of the elongated body region 210. In contrast, a second end 213 of the elongated body region. 210 is indirectly coupled to the bitline 228 through the drain region 232.

Figure 3:
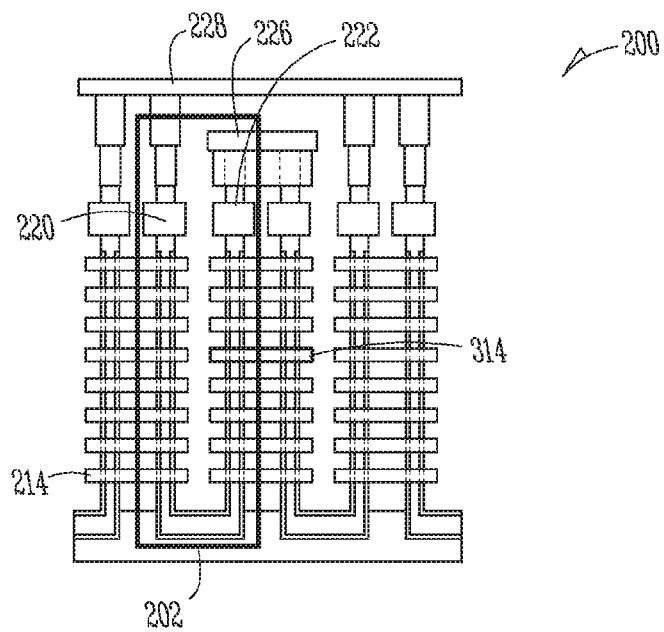
FIG. 3 shows a memory device during a program operation according to an embodiment of the invention.

FIG. 3 shows a memory device 200 undergoing an example program operation according to an embodiment of the invention. The memory device 200 from previous Figures is used as an example. As in FIG. 2A, an example memory cell string 202 is circled.

With FIG. 3 as a reference, the bitline 228, source line 226 and source select gate 222 are biased to respective program enable voltages (e.g., approximately zero volts each). A selected gate 314 is biased with a program voltage (e.g., approximately 20 volts), while the drain select gate 220 of the selected string 202 is biased to, e.g., approximately 2 volts. The potential difference between the selected gate 314 and the body region of the selected string 202 (e.g., 20 volts to zero volts) is used to transfer charge to the charge storage structure adjacent to the selected gate 314 in the selected memory cell string 202. To avoid programming a memory cell corresponding to selected gate 314 in the adjacent, unselected string, the drain select gate of that string can be biased to, for example, approximately zero volts. Unselected gates 214 are biased with an inhibit voltage (e.g., approximately 10 volts) to couple up the body region of the unselected string to an inhibit voltage.

Figure 4:
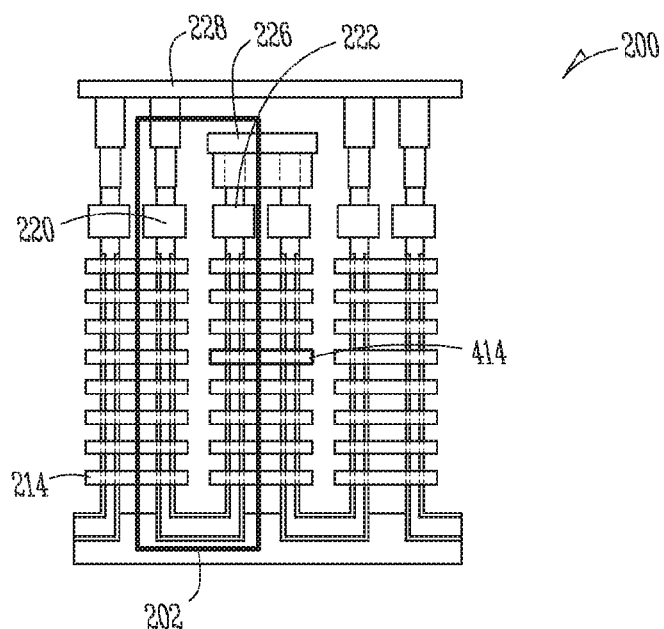
FIG. 4 shows a memory device during a read operation according to an embodiment of the invention.

FIG. 4 shows a memory device 200 undergoing an example read operation according to an embodiment of the invention. The memory device 200 from previous Figures is used as an example. As in previous Figures, an example memory cell string 202 circled.

With FIG. 4 as a reference, the bit line 228 is biased to, for example, approximately 0.5 volts, and the source line 226 is biased to, for example, approximately zero volts. A selected gate 314 is biased with a read voltage (e.g., between approximately 0 volts and approximately 4 volts, such as depending upon what program state is being read), while the drain select gate 220 of the selected string 202 is biased to, e.g., approximately 2 volts. Unselected gates 214 are biased to a pass voltage (e.g., approximately 6 volts) to permit a signal to pass along the elongated body region of the selected string. If gate 314 is erased, then the signal will pass through the elongated body region of the selected string and be detected. To avoid reading a memory cell corresponding to selected gate 314 in an adjacent, unselected string, the drain select gate of that string can be biased to, for example, approximately zero volts.

Figure 5:
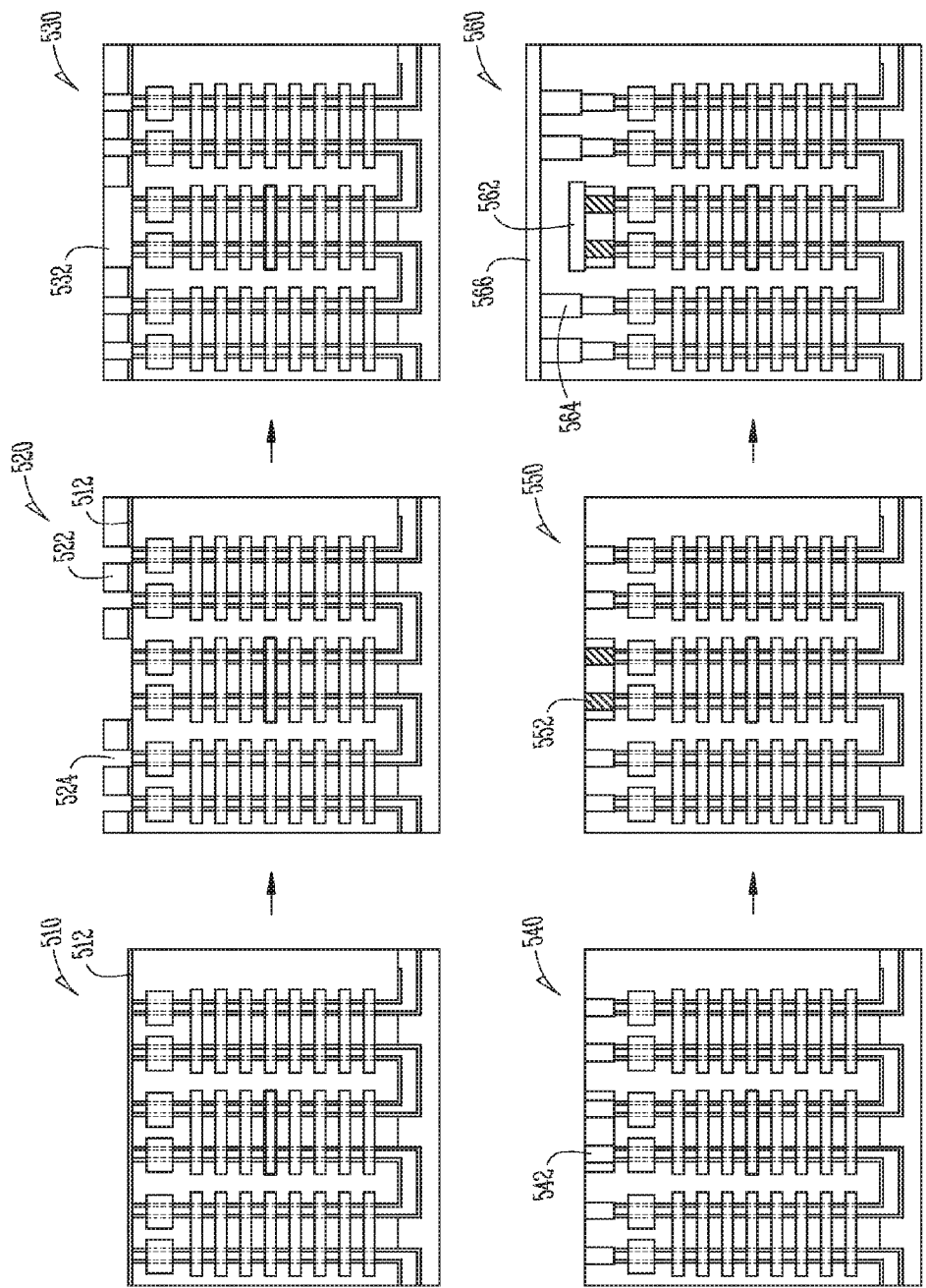
FIG. 5 shows selected stages of forming a memory device according to an embodiment of the invention.

FIG. 5 illustrates an example process flow to form selected portions of a memory device according to an embodiment of the invention. In particular, the example process flow of FIG. 5 illustrates one method of directly coupling an elongated body region to a sourceline. Operation 510 illustrates a planarization and etch stop operation. In one embodiment, an etch stop layer 512 is a silicon nitride (SiN) layer. Operation 520 illustrates a dielectric layer 522 deposition and patterning step. A number of openings 524 are shown formed in the dielectric layer 522 by etching or other suitable process. Operation 530 illustrates formation of source regions and drain regions by filling in the number of openings 524 with an n doped semiconductor. In one embodiment, the number of openings 524 are filled with an n+ polysilicon material Operation 540 illustrates formation of a second number of openings 542 within the filled portion that will become source regions. In operation 550, the second number of openings 542 are filled to form an extension of the elongated body regions. In one example, the second number of openings 542 are filled with the same material as the elongated body region. In one example, the second number of openings 542 are filled with p+ polysilicon. Operation 560 illustrates a routing layer formation. Sourcelines 562, plugs 564 and bitlines 566 may be formed as part of the routing layer formation.

Figure 6:
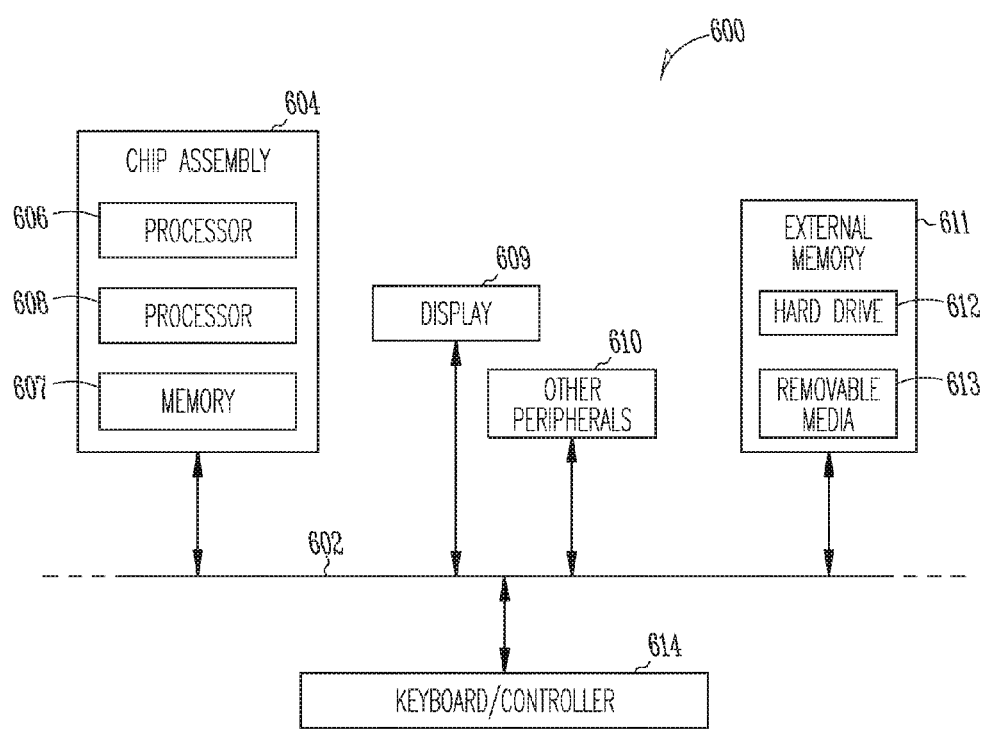
FIG. 6 shows an information handling system using a memory device according to an embodiment of the invention.

An embodiment of an information handling system such as a computer is included in FIG. 6 to show an embodiment of a high-level device application for the present invention. FIG. 6 is a block diagram of an information handling system 600 incorporating a memory device according to embodiments of the invention as described above. Information handling system 600 is merely one embodiment of an electronic system in which decoupling systems of the present invention can be used. Other examples include, but are not limited to, tablet computers, cameras, personal data assistants (PDAs), cellular telephones, MP3 players, aircraft, satellites, military vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 607 is included in the chip assembly 604. In one embodiment, the memory device 607 includes a NAND memory device according to embodiments described above.

In one embodiment, additional logic chips 608 other than processor chips are included in the chip assembly 604. An example of a logic chip 608 other than a processor includes an analog to digital converter. Other circuits on logic chips 608 such as custom circuits, an application-specific integrated circuit (ASIC), etc. are also included in one embodiment of the invention.

Information handling system 600 may also include an external memory 611, which in turn can include one or more memory elements suitable to the particular application, such as one or more hard drives 612, and/or one or more drives that handle removable media 613 such as compact disks (CDs), flash drives, digital video disks (DVDs), and the like. A semiconductor memory die constructed as described in examples above is included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A memory device, comprising:
a data line;
a source;
a first string of memory cells coupled at a first end to the data line by a first select gate, and directly coupled at a second end to the source through a second select gate;
a second string of memory cells coupled at a first end to the data line by a third select gate, and directly coupled at a second end to the source through a fourth select gate; and
a controller, wherein the controller is configured to concurrently bias the data line and the source to substantially the same potential, and perform a program operation on a selected memory cell of the first string of memory cells.

2. The memory device of claim 1, wherein the controller is further configured to bias the first select gate to a potential greater than the potential to which it concurrently biases the data line.

3. The memory device of claim 1, wherein the first and the second strings of memory cells are vertically formed above a substrate.

4. A memory device, comprising:
a plurality of strings of memory cells, where each string of memory cells is coupled at a first end to a data line and where each string of memory cells is directly coupled at a second end to a source; and
a controller, wherein the controller is configured to concurrently bias the data line and the source to a substantially same potential and to perform a program operation on a selected memory cell of a selected string of memory cells while the data line and the source are biased to substantially the same potential.

5. The memory device of claim 4, wherein the plurality of strings of memory cells comprise vertically formed strings of memory cells.

6. A memory device, comprising:
a plurality of strings of memory cells, where each string of memory cells is coupled at a first end to a data line and where each string of memory cells is directly coupled at a second end to a source; and
a controller, wherein the controller is configured to concurrently float the data line, bias the source to an erase potential, and perform an erase operation on the memory cells of the plurality of strings of memory cells.

7. The memory device of claim 6, wherein the controller is further configured to bias a control gate of each memory cell of the plurality of strings of memory cells to a potential less than the erase potential to which the source is biased during the erase operation.

8. The memory device of claim 6, wherein the potential to which the control gates of the memory cells are biased comprises a ground potential.

9. An electronic system, comprising:
a communications interface;
a memory access device coupled to the communications interface and configured to generate memory device commands; and
a memory device coupled to the communications interface and configured to be responsive to the memory device commands, the memory device comprising:
a data line;
a source;
a first string of memory cells coupled at a first end to the data line by a first select gate, and directly coupled at a second end to the source through a second select gate;
a second string of memory cells coupled at a first end to the data line by a third select gate, and directly coupled at a second end to the source through a fourth select gate; and a controller, wherein the controller is configured to concurrently bias the data line and the source to substantially a same potential, and perform a program operation on a selected memory cell of the first string of memory cells.

10. The electronic system of claim 9, wherein t S ring and the second string comprise vertically formed strings of memory cells.

11. A memory device, comprising:
- an elongated body region, having a source region coupled to a first d and a drain region coupled to a second end;
- a plurality of gates along a length of the elongated body region, each of the plurality f gates being separated from the elongated body region by at least a charge storage structure; and
- a source line directly coupled to the body region, wherein the source region surrounds a cross section of the first end of the elongated body region and is also coupled to the source line.

12. The memory device of claim 11, wherein the elongated body region oriented vertically.

13. The memory device of claim 11, wherein the elongated body region is oriented horizontally.

14. The memory device of claim 11, wherein the elongated body region forms a "U" shape.

15. The memory device of claim 11, further including a controller, wherein the controller is configured to concurrently bias the data line and the source to substantially the same potential, and perform a program operation on a selected memory cell of the first string of memory cell.

16. The memory device of claim 11, further including a controller, wherein the controller is configured to concurrently bias the data line and the source to a substantially same potential and to perform a program operation on a selected memory cell of a selected string of memory cells while the data line and the source are biased to substantially the same potential.

17. The memory device of claim 11, further including a controller, wherein the controller is configured to concurrently float the data line, bias the source to an erase potential, and perform an erase operation on the memory cells of the plurality of strings of memory cells.

* * * * *